(12) United States Patent
Westhoff et al.

(10) Patent No.: US 7,829,442 B2
(45) Date of Patent: Nov. 9, 2010

(54) SEMICONDUCTOR HETEROSTRUCTURES HAVING REDUCED DISLOCATION PILE-UPS AND RELATED METHODS

(75) Inventors: Richard Westhoff, Hudson, NH (US); Vicky K. Yang, Brookline, MA (US); Matthew T. Currie, Brookline, MA (US); Christopher Vineis, Watertown, MA (US); Christopher Leitz, Nashua, NH (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 11/941,629

(22) Filed: Nov. 16, 2007

(65) Prior Publication Data

US 2008/0079024 A1 Apr. 3, 2008

Related U.S. Application Data

(63) Continuation of application No. 10/646,353, filed on Aug. 22, 2003, now Pat. No. 7,375,385.

(60) Provisional application No. 60/405,484, filed on Aug. 23, 2002.

(51) Int. Cl.
*H01L 21/20* (2006.01)

(52) U.S. Cl. ................. 438/478; 257/E21.125

(58) Field of Classification Search ............ 438/37, 438/87, 455, 483, 478, 482, E21.123, E21.135
See application file for complete search history.

(56) References Cited

U.S. PATENT DOCUMENTS

| | | | |
|---|---|---|---|
| 4,010,045 A | 3/1977 | Ruehrwein | |
| 4,710,788 A | 12/1987 | Dambkes et al. | |
| 4,900,372 A | 2/1990 | Lee et al. | |
| 4,987,462 A | 1/1991 | Kim et al. | |
| 4,990,979 A | 2/1991 | Otto et al. | |
| 4,997,776 A | 3/1991 | Harame et al. | |
| 5,013,681 A | 5/1991 | Godbey et al. | |
| 5,091,767 A | 2/1992 | Bean et al. | |

(Continued)

FOREIGN PATENT DOCUMENTS

DE 4101167 7/1992

(Continued)

OTHER PUBLICATIONS

"2 Bit/Cell EEPROM Cell Using Band to Band Tunneling for Data Read-Out," *IBM Technical Disclosure Bulletin*, vol. 35, No. 4B (Sep. 1992) pp. 136-140.

(Continued)

*Primary Examiner*—Minh-Loan T Tran
*Assistant Examiner*—Kevin Quinto
(74) *Attorney, Agent, or Firm*—Slater & Matsil, L.L.P.

(57) ABSTRACT

Dislocation pile-ups in compositionally graded semiconductor layers are reduced or eliminated, thereby leading to increased semiconductor device yield and manufacturability. This is accomplished by introducing a semiconductor layer having a plurality of threading dislocations distributed substantially uniformly across its surface as a starting layer and/or at least one intermediate layer during growth and relaxation of the compositionally graded layer. The semiconductor layer may include a seed layer disposed proximal to the surface of the semiconductor layer and having the threading dislocations uniformly distributed therein.

16 Claims, 6 Drawing Sheets

U.S. PATENT DOCUMENTS

| | | |
|---|---|---|
| 5,097,630 A | 3/1992 | Maeda et al. |
| 5,155,571 A | 10/1992 | Wang et al. |
| 5,159,413 A | 10/1992 | Calviello et al. |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,210,052 A | 5/1993 | Takasaki et al. |
| 5,212,110 A | 5/1993 | Pfiester et al. |
| 5,221,413 A | 6/1993 | Brasen et al. |
| 5,241,197 A | 8/1993 | Murakami et al. |
| 5,250,445 A | 10/1993 | Bean et al. |
| 5,252,173 A | 10/1993 | Inoue et al. |
| 5,279,687 A | 1/1994 | Tuppen et al. |
| 5,285,086 A | 2/1994 | Fitzgerald, Jr. |
| 5,291,439 A | 3/1994 | Kauffmann et al. |
| 5,298,452 A | 3/1994 | Meyerson |
| 5,308,444 A | 5/1994 | Fitzgerald et al. |
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel et al. |
| 5,387,796 A | 2/1995 | Joshi et al. |
| 5,399,522 A | 3/1995 | Ohori et al. |
| 5,413,679 A | 5/1995 | Godbey |
| 5,424,243 A | 6/1995 | Takasaki et al. |
| 5,425,846 A | 6/1995 | Koze et al. |
| 5,426,069 A | 6/1995 | Selvakumar et al. |
| 5,426,316 A | 6/1995 | Mohammad |
| 5,434,102 A | 7/1995 | Watanabe et al. |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse et al. |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,596,527 A | 1/1997 | Tomioka et al. |
| 5,617,351 A | 4/1997 | Bertin et al. |
| 5,630,905 A | 5/1997 | Lynch et al. |
| 5,633,516 A | 5/1997 | Mishima et al. |
| 5,659,187 A | 8/1997 | Legoues et al. |
| 5,683,934 A | 11/1997 | Candelaria |
| 5,698,869 A | 12/1997 | Yoshimi et al. |
| 5,714,777 A | 2/1998 | Ismail et al. |
| 5,728,623 A | 3/1998 | Mori et al. |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,801,085 A | 9/1998 | Kim et al. |
| 5,808,344 A | 9/1998 | Ismail et al. |
| 5,810,924 A | 9/1998 | Legoues et al. |
| 5,828,114 A | 10/1998 | Kim et al. |
| 5,847,419 A | 12/1998 | Imai et al. |
| 5,859,864 A | 1/1999 | Jewell |
| 5,877,070 A | 3/1999 | Goesele et al. |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,943,560 A | 8/1999 | Chang et al. |
| 5,963,817 A | 10/1999 | Chu et al. |
| 5,966,622 A | 10/1999 | Levine et al. |
| 5,998,807 A | 12/1999 | Lustig et al. |
| 6,010,937 A | 1/2000 | Karam et al. |
| 6,013,134 A | 1/2000 | Chu et al. |
| 6,030,884 A | 2/2000 | Mori et al. |
| 6,033,974 A | 3/2000 | Henley et al. |
| 6,033,995 A | 3/2000 | Muller |
| 6,039,803 A | 3/2000 | Fitzgerald et al. |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,124,614 A | 9/2000 | Ryum et al. |
| 6,130,453 A | 10/2000 | Mei et al. |
| 6,133,799 A | 10/2000 | Favors et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,184,111 B1 | 2/2001 | Henley et al. |
| 6,191,006 B1 | 2/2001 | Mori et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto et al. |
| 6,210,988 B1 | 4/2001 | Howe et al. |
| 6,218,677 B1 | 4/2001 | Broekaert |
| 6,232,138 B1 * | 5/2001 | Fitzgerald et al. ............. 438/46 |
| 6,235,567 B1 | 5/2001 | Huang |
| 6,242,324 B1 | 6/2001 | Kub et al. |
| 6,249,022 B1 | 6/2001 | Lin et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,291,321 B1 | 9/2001 | Fitzgerald |
| 6,313,016 B1 | 11/2001 | Kibbel et al. |
| 6,316,301 B1 | 11/2001 | Kant |
| 6,323,108 B1 | 11/2001 | Kub et al. |
| 6,329,063 B2 | 12/2001 | Lo et al. |
| 6,335,546 B1 | 1/2002 | Tsuda et al. |
| 6,339,232 B1 | 1/2002 | Takagi et al. |
| 6,350,993 B1 | 2/2002 | Chu et al. |
| 6,368,733 B1 | 4/2002 | Nishinaga et al. |
| 6,372,356 B1 | 4/2002 | Thornton et al. |
| 6,399,970 B2 | 6/2002 | Kubo et al. |
| 6,403,975 B1 | 6/2002 | Brunner et al. |
| 6,406,589 B1 | 6/2002 | Yanagisawa et al. |
| 6,407,406 B1 | 6/2002 | Tezuka et al. |
| 6,420,937 B1 | 7/2002 | Akatsuka et al. |
| 6,425,951 B1 | 7/2002 | Chu et al. |
| 6,429,061 B1 | 8/2002 | Rim |
| 6,475,072 B1 * | 11/2002 | Canaperi et al. ............. 451/65 |
| 6,482,749 B1 | 11/2002 | Billington et al. |
| 6,503,773 B2 | 1/2003 | Fitzgerald |
| 6,515,335 B1 | 2/2003 | Christiansen et al. |
| 6,518,644 B2 | 2/2003 | Fitzgerald |
| 6,521,041 B2 | 2/2003 | Wu et al. |
| 6,525,338 B2 | 2/2003 | Mizushima et al. |
| 6,555,839 B2 | 4/2003 | Fitzgerald |
| 6,573,126 B2 | 6/2003 | Cheng et al. |
| 6,576,532 B1 | 6/2003 | Jones et al. |
| 6,583,015 B2 | 6/2003 | Fitzgerald et al. |
| 6,593,191 B2 | 7/2003 | Fitzgerald |
| 6,594,293 B1 | 7/2003 | Bulsara et al. |

| | | | |
|---|---|---|---|
| 6,602,613 B1 | 8/2003 | Fitzgerald | |
| 6,603,156 B2 | 8/2003 | Rim | |
| 6,833,332 B2 | 12/2004 | Christiansen et al. | |
| 7,041,170 B2 | 5/2006 | Fitzgerald et al. | |
| 7,049,627 B2 | 5/2006 | Vineis et al. | |
| 2001/0003364 A1 | 6/2001 | Sugawara et al. | |
| 2001/0014570 A1 | 8/2001 | Wenski et al. | |
| 2002/0017642 A1 | 2/2002 | Mizushima et al. | |
| 2002/0043660 A1 | 4/2002 | Yamazaki et al. | |
| 2002/0052084 A1 | 5/2002 | Fitzgerald | |
| 2002/0084000 A1 | 7/2002 | Fitzgerald | |
| 2002/0096717 A1 | 7/2002 | Chu et al. | |
| 2002/0100942 A1 | 8/2002 | Fitzgerald et al. | |
| 2002/0123167 A1 | 9/2002 | Fitzgerald | |
| 2002/0123183 A1 | 9/2002 | Fitzgerald | |
| 2002/0123197 A1 | 9/2002 | Fitzgerald et al. | |
| 2002/0125471 A1 | 9/2002 | Fitzgerald et al. | |
| 2002/0125497 A1 | 9/2002 | Fitzgerald | |
| 2002/0168864 A1 | 11/2002 | Cheng et al. | |
| 2002/0185686 A1 | 12/2002 | Christiansen et al. | |
| 2003/0003679 A1 | 1/2003 | Doyle et al. | |
| 2003/0013323 A1 | 1/2003 | Hammond et al. | |
| 2003/0025131 A1 | 2/2003 | Lee et al. | |
| 2003/0034529 A1 | 2/2003 | Fitzgerald et al. | |
| 2003/0041798 A1 | 3/2003 | Wenski et al. | |
| 2003/0057439 A1 | 3/2003 | Fitzgerald | |
| 2003/0077867 A1 | 4/2003 | Fitzergald | |
| 2003/0102498 A1 | 6/2003 | Braithwaite et al. | |
| 2003/0186073 A1 | 10/2003 | Fitzgerald | |
| 2003/0230233 A1 | 12/2003 | Fitzgerald et al. | |
| 2009/0311477 A1 | 12/2009 | Aspar et al. | |

FOREIGN PATENT DOCUMENTS

| | | |
|---|---|---|
| EP | 0353423 | 2/1990 |
| EP | 0514018 | 11/1992 |
| EP | 0587520 | 3/1994 |
| EP | 0683522 | 11/1995 |
| EP | 0828296 | 3/1998 |
| EP | 0829908 | 3/1998 |
| EP | 0838858 | 4/1998 |
| EP | 1014431 | 6/2000 |
| EP | 1020900 | 7/2000 |
| EP | 1174928 | 1/2002 |
| GB | 2342777 | 4/2000 |
| JP | 6114116 | 6/1986 |
| JP | 6373398 | 4/1988 |
| JP | 01-170015 | 7/1989 |
| JP | 2210816 | 8/1990 |
| JP | 336717 | 2/1991 |
| JP | 4307974 | 10/1992 |
| JP | 05-121450 | 5/1993 |
| JP | 5166724 | 7/1993 |
| JP | 6-177046 | 6/1994 |
| JP | 6244112 | 9/1994 |
| JP | 6252046 | 9/1994 |
| JP | 794420 | 4/1995 |
| JP | 7106446 | 4/1995 |
| JP | 07-169926 | 7/1995 |
| JP | 7240372 | 9/1995 |
| JP | 10270685 | 10/1998 |
| JP | 11233744 | 8/1999 |
| JP | 2000021783 | 1/2000 |
| JP | 2000031491 | 1/2000 |
| JP | 2000513507 | 10/2000 |
| JP | 2001319935 | 11/2001 |
| JP | 2002-502121 | 1/2002 |
| JP | 2002076334 | 3/2002 |
| JP | 2002-118254 | 4/2002 |
| JP | 2002164520 | 6/2002 |
| JP | 2002289533 | 10/2002 |
| JP | 2002356399 | 12/2002 |
| JP | 2003-022970 | 1/2003 |
| JP | 2003-051444 | 2/2003 |
| JP | 2003520444 | 7/2003 |
| WO | WO-98/59365 | 12/1998 |
| WO | WO-99/53539 | 10/1999 |
| WO | WO-00/48239 | 8/2000 |
| WO | WO 00/54338 | 9/2000 |
| WO | WO-00/54338 | 9/2000 |
| WO | WO-01/22482 | 3/2001 |
| WO | WO-01/54175 | 7/2001 |
| WO | WO-01/54202 | 7/2001 |
| WO | WO-01/93338 | 12/2001 |
| WO | WO-01/99169 | 12/2001 |
| WO | WO-02/13262 | 2/2002 |
| WO | WO-02/15244 | 2/2002 |
| WO | WO-02/27783 | 4/2002 |
| WO | WO-02/47168 | 6/2002 |
| WO | WO-02/071488 | 9/2002 |
| WO | WO-02/071491 | 9/2002 |
| WO | WO-02/071495 | 9/2002 |
| WO | WO-02/082514 | 10/2002 |
| WO | WO-03/015140 | 2/2003 |
| WO | WO-03/105189 | 12/2003 |

OTHER PUBLICATIONS

"How to Make Silicon," Wacker University, http://www.wafernet.com/PresWK/h-ptl-as3_wsc_siltronic_com_pages_training_pages_Silic..., (Aug. 28, 2002).

"Optical Growth Technique and Structure for Strain Relaxation of Si-Ge Layers on Si Substrates," *IBM Technical Disclosure Bulletin*, vol. 32, No. 8A (Jan. 1990) pp. 330-331.

Armstrong et al., "Design of Si/SiGe Heterojunction Complementary Metal-Oxide-Semiconductor Transistors," *IEDM Technical Digest (1995 International Electron Devices Meeting)*, pp. 761-764.

Armstrong, "Technology for SiGe Heterostructure-Based CMOS Devices," PhD Thesis, Massachusetts Institute of Technology, 1999, pp. 1-154.

Augusto et al., "Proposal for a New Process Flow for the Fabrication of Silicon-Based Complementary MOD-MOSFETs without Ion Implantation," *Thin Solid Films*, vol. 294, No. 1-2 (Feb. 15, 1997), pp. 254-258.

Barradas et al., "RBS analysis of MBE-grown SiGe/(001) Si heterostructures with thin, high Ge content SiGe channels for HMOS transistors," *Modern Physics Letters B*, vol. 15 (2001), abstract.

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999), pp. 205-210.

Bouillon et al., "Search for the optimal channel architecture for 0.18/0.12 μm bulk CMOS experimental study," *IEEE* (1996), pp. 21.2.1-21.2.4.

Bruel et al., "® SMART CUT: A Promising New SOI Material Technology," Proceedings of the 1995 IEEE International SOI Conference (Oct. 1995), pp. 178-179.

Bruel, "Silicon on Insulator Material Technology," *Electronic Letters*, vol. 13, No. 14 (Jul. 6, 1995), pp. 1201-1202.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998), pp. 5597-5602.

Bulsara et al., "Relaxed $In_xGa_{1-x}As$ Graded Buffers Grown with Organometallic Vapor Phase Epitaxy on GaAs," *Applied Physics Letters*, vol. 72, Issue 13 (Jul. 30, 1998), pp. 1608-1610.

Bulsara, "Materials Issues with the Integration of Lattice-Mismatched $In_xGa_{1-x}As$ on GaAs," PhD Thesis, MIT, Jun. 1998, pp. 1-178.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100-104.

Buttard et al., "Toward Two-Dimensional Self-Organization of Nanostructures Using Wafer Bonding and Nanopatterned Silicon Surfaces," *IEEE—2002 Journal of Quantum Electronics*, vol. 38, Issue 8 (Aug. 2002), pp. 995-1005.

Canaperi et al., "Preparation of a relaxed Si-Ge layer on an insulator in fabricating high-speed semiconductor devices with strained epitaxial films," International Business Machines Corporation, USA (2002), abstract.

Carlin et al., "High Efficiency GaAs-on-Si Solar Cells with High Voc using Graded Gesi Buffers," *IEEE—2000* (2000), pp. 1006-1011.

Carlin et al., "Investigation and Development of High Quality GaAs-on-Si for Space Photovoltaics Using a Graded GeSi," PhD Thesis, Ohio State University, 2001, pp. 1-232.

Chang et al., "Selective Etching of SiGe/Si Heterostructures," *Journal of the Electrochemical Society*, No. 1 (Jan. 1991), pp. 202-204.

Charasse et al., "MBE Growth of GaAs on Si at Thomson," *Institute of Electronic Structure and Laser*.

Cheng et al., "Electron Mobility Enhancement in Strained-si n-MOSFETs Fabricated on SiGe-on-Insulator (SGOI) Substrates," *IEEE Electron Device Letters*, vol. 22, No. 7 (Jul. 2001), pp. 321-323.

Cheng et al., "Relaxed Silicon-Germanium on Insulator Substrate by Layer Transfer," *Journal of Electronic Materials*, vol. 30, No. 12 (2001), pp. L37-L39.

Crumbaker et al., "The Influence of Dislocation Density on Electron Mobility in InP Films on Si," *Applied Physics Letters*, vol. 59, Issue 9 (Aug. 26, 1991), pp. 1090-1092.

Cullis et al., "Growth ripples upon strained SiGe epitaxial layers on Si and misfit dislocation interactions," *Journal of Vacuum Science and Technology A*, vol. 12, No. 4 (Jul./Aug. 1994), pp. 1924-1931.

Currie et al., "Carrier mobilities and process stability of strained Si n- and p-MOSFETs on SiGe virtual substrates," *Journal of Vacuum Science and Technology B*, vol. 19, No. 6(Nov./Dec. 2001), pp. 2268-2279.

Currie et al., "Controlling Threading Dislocation Densities in Ge on Si Using Graded SiGe Layers and Chemical-Mechanical Polishing," *Applied Physics Letters*, vol. 72, Issue 14 (Apr. 6, 1998), pp. 1718-1720.

Currie, "SiGe Virtual Substrate Engineering for Integration of III-V Materials, Microelectromechanical Systems and Strained Silicon MOSFETs with Silicon," PhD Thesis, MIT, 2001, pp. 1-190.

Dilliway et al., "Characterization of Morphology and Defects in Silicon Germanium Virtual Substrates," *Journal of Materials Science*, vol. 11, Issue 7 (2000), pp. 549-556.

Eaglesham et al., "Dislocation-Free Stranski-Krastanow Growth of Ge on Si(100)," *Physical Review Letters*, vol. 64, No. 16 (Apr. 16, 1990) pp. 1943-1946.

Erdtmann et al., "Gainas/Inp Quantum Well Infrared Photodetectors on Si Substrate for Low-Cost Focal Plan Arrays," PhD Thesis, Northwestern University, 2000, pp. 1-225.

European Patent Office Communication Application No. 03 759 202.9-2203, dated May 31, 2007 (3 pages).

European Search Report for Application No. EP 03 75 9202 mailed May 23, 2007 (7 pages).

Feichtinger et al., "Misfit Dislocation Nucleation Study in p/p+ Silicon," *Journal of the Electrochemical Society*, vol. 148, No. 7 (2001) pp. G379-G382.

Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994) pp. 493-496.

Fischetti et al., "Band structure, deformation potentials, and carrier mobility in strained Si, Ge, and SiGe alloys," *Journal of Applied Physics*, vol. 80, No. 4 (Aug. 15, 1996), pp. 2234-2252.

Fischetti, "Long-range Coulomb interactions in small Si devices. Part II. Effective electronmobility in thin-oxide structures," *Journal of Applied Physics*, vol. 89, No. 2 (Jan. 15, 2001), pp. 1232-1250.

Fitzgerald et al., "Dislocation dynamics in relaxed graded composition semiconductors," *Materials Science and Engineering*, B67 (1999), pp. 53-61.

Fitzgerald et al., "GeSi/Si Nanostructures," Department of Material Science, MIT (1995) pp. 1-15.

Fitzgerald et al., "Relaxed GexSi1-x structures for III-V integration with Si and high mobility two-dimensional electron gases in Si," *Joural of Vacuum Science Technology*, B vol. 10, No. 4, 1992, pp. 1807-1819.

Fitzgerald et al., "Totally Relaxed GexSi1-x Layers with Low Threading Dislocation Densities Grown on Si Substrates," *Applied Physics Letters*, vol. 59, No. 7 (Aug. 12, 1991), pp. 811-813.

Fitzgerald, "Dislocations in strained-layer epitaxy: theory, experiment, and applications," *Materials Science Reports*, vol. 7 (1991) pp. 87-142.

Garone et al., "Silicon vapor phase epitaxial growth catalysis by the presence of germane," *Applied Physics Letters*, vol. 56, No. 13 (Mar. 16, 1990), pp. 1275-1277.

Giovane et al., "Strain-Balanced Silicon-Germanium Materials for Near IR Photodetection in Silicon-Based Optical Interconnects," PhD Thesis, MIT, (1998) pp. 1-134.

Gray et al., "Analysis and Design of Analog Integrated Circuits," John Wiley & Sons, (1984) pp. 605-632.

Grillot et al., "Acceptor diffusion and segregation in (A1xGa1-x)0.5In0.5P heterostructures," *Journal of Applied Physics*, vol. 91, No. 8 (Apr. 15, 2002) pp. 4891-1899.

Groenert et al., "Strategies for Direct Monolithic Integration of AlxGa(1-x)As/InxGa(1-x)As LEDS and Lasers on Ge/GeSi/Si Substrates Via Relaxed Graded GexSi(1-x) Buffer Layers," *Materials Research Society Symposium Proceedings*, vol. 692 (2002) pp. H.9.30.1-H.9.30.6.

Grutzmacher et al., "Ge segregation in SiGe/Si heterostructures and its dependence on deposition technique and growth atmosphere," *Applied Physics Letters*, vol. 63, No. 18 (Nov. 1, 1993) pp. 2531-2533.

Hackbarth et al., "Alternatives to thick MBE-grown relaxed SiGe buffers," *Thin Solid Films*, vol. 369, Nos. 1-2 (Jul. 2000) pp. 148-151.

Hackbarth et al., "Strain relieved SiGe buffers for Si-based heterostructure field-effect transistors," *Journal of Crystal Growth*, vol. 201/202 (1999) pp. 734-738.

Herzog et al., "SiGe-based FETs: buffer issues and device results," *Thin Solid Films*, vol. 380 (2000) pp. 36-41.

Hock et al., "Carrier mobilities in modulation doped Si1-xGex heterostructures with respect to FET applications," *Thin Solid Films*, vol. 336 (1998) pp. 141-144.

Hock et al., "High hole mobility in Si0.17 Ge0.83 channel metal-oxide-semiconductor field-effect transistors grown by plasma-enhanced chemical vapor deposition," *Applied Physics Letters*, vol. 76, No. 26 (Jun. 26, 2000) pp. 3920-3922.

Hock et al., "High performance 0.25 μm p-type Ge/SiGe MODFETs," *Electronics Letters*, vol. 34, No. 19 (Sep. 17, 1998) pp. 1888-1889.

Houghton, "Strain Relaxation Kinetics in $Si_{1-x}Ge_x$/Si Heterostructures," *Journal of Applied Physics*, vol. 70, No. 4 (Aug. 15, 1991), pp. 2136-2151.

Hsu et al., "Near Field Scanning Optical Microscopy Studies of Electronic and Photonic Materials and Devices," *Materials Science and Engineering Reports: A Review Journal*, vol. 33 (2001) pp. 1-50.

Hsu et al., "Surface morphology of related GexSi1-x films," *Applied Physics Letters*, vol. 61, No. 11 (Sep. 14, 1992) pp. 1293-1295.

Huang et al., "High-quality strain-relaxed SiGe alloy grown on implanted silicon-on-insulator substrate," *Applied Physics Letters*, vol. 76, No. 19 (May 8, 2000) pp. 2680-2682.

Huang et al., "The Impact of Scaling Down to Deep Submicron on CMOS RF Circuits" *IEEE Journal of Solid-State Circuits*, vol. 33, No. 7 (Jul. 1998) pp. 1023-1036.

International Search Report for International Patent Application No. PCT/US2003/26467, dated Jul. 13, 2004, 3 pages.

Ishikawa et al., "Creation of Si-Ge-based SIMOX structures by low energy oxygen implantation," Proceedings of the 1997 IEEE International SOI Conference (Oct. 1997) pp. 16-17.

Ishikawa et al., "SiGe-on-insulator substrate using SiGe alloys grown Si(001)," *Applied Physics Letters*, vol. 75, No. 7 (Aug. 16, 1999) pp. 983-985.

Ismail et al., "Modulation-doped n-type Si/SiGe with inverted interface," *Applied Physics Letters*, vol. 65, No. 10 (Sep. 5, 1994) pp. 1248-1250.

Ismail, "Si/SiGe High-Speed Field-Effect Transistors," Electron Devices Meeting, Washington, D.C. (Dec. 10, 1995) pp. 20.1.1-20.1.4.

Kearney et al., "The effect of alloy scattering on the mobility of holes in a Si1-xGex quantum well," *Semiconductor Science and Technology*, vol. 13 (1998) pp. 174-180.

Kim et al., "A Fully Integrated 1.9-GHz CMOS Low-Noise Amplifier," *IEEE Microwave and Guided Wave Letters*, vol. 8, No. 8 (Aug. 1998) pp. 293-295.

Kissinger et al., "Stepwise Equilibrated Graded SexSi1x Buffer with Very Low Threading Dislocation Density on Si(001)," *American Institute of Physics / Applied Physics Letters*, vol. 66, Issue 16 (Apr. 17, 1995) pp. 2083-2085.

Knall et al., "The Use of Graded in GaAs Layers and Patterned Substrates to Remove Threading Dislocations From GaAs on Si," *Journal of Applied Physics*, vol. 76, Issue 5 (Sep. 1, 1994) pp. 2697-2702.

Koester et al., "Extremely High Transconductance Ge/Si0.4Ge0.6 p-MODFET's Grown by UHV-CVD," *IEEE Electron Device Letters*, vol. 21, No. 3 (Mar. 2000) pp. 110-112.

Konig et al., "Design Rules for n-Type SiGe Hetero FETs," *Solid State Electronics*, vol. 41, No. 10 (1997) pp. 1541-1547.

Konig et al., "p-Type Ge-Channel MODFET's with High Transconductance Grown on Si Substrates," *IEEE Electron Device Letters*, vol. 14, No. 4 (Apr. 1993) pp. 205-207.

Konig et al., "SiGe HBTs and HFETs," *Solid-State Electronics*, vol. 38, No. 9 (1995) pp. 1595-1602.

Kummer et al., "Low Energy plasma enhanced chemical vapor deposition" *Materials Science and Engineering*, B89 (2002), pp. 288-295.

Kuznetsov et al., "Technology for high-performance n-channel SiGe modulation-doped field-effect transistors," *Journal of Vacuum Science and Technology*, B 13(6) (Nov./Dec. 1995) pp. 2892-2896.

LaGoues et al., "Relaxation of SiGe Thin Films Grown on Si/SiO2 Substrates," *Journal of Applied Physics*, vol. 75, Issue 11 (Jun. 1, 1974) pp. 2730-2738.

Langdo, "High Quality Ge on Si by Epitaxial Necking," *Applied Physics Letters*, vol. 76, Issue 25 (Jun. 19, 2000) pp. 3700-3702.

Larson, "Integrated Circuit Technology Options for RFIC's Present Status and Future Directions," *IEEE Journal of Solid-State Circuits*, vol. 33, No. 3 (Mar. 1998), pp. 387-399.

Lee et al., "CMOS RF Integrated Circuits at 5 GHz and Beyond," *Proceedings of the IEEE*, vol. 88, No. 10 (Oct. 2000) pp. 1560-1571.

Lee et al., "Strained Ge channel p-type metal-oxide-semiconductor field-effect transistors grown on Si1-xGex/Si virtual substrates," *Applied Physics Letters*, vol. 79, No. 20 (Nov. 12, 2001) pp. 3344-3346.

Lee et al., "Strained Ge channel p-type MOSFETs fabricated on Si1-xGex/Si virtual substrates," *Materials Research Society Symposium Proceedings*, vol. 686 (2002) pp. A1.9.1-A1.9.5.

Leitz et al., "Channel Engineering of SiGe-Based Heterostructures for High Mobility MOSFETs," *Materials Research Society Symposium Proceedings*, vol. 686 (2002) pp. A3.10.1-A3.10.6.

Leitz et al., "Dislocation glide and blocking kinetics in compositionally graded SiGe/Si", *Journal of Applied Physics*, vol. 90, No. 6 (Sep. 15, 2001) pp. 2730-2736.

Leitz et al., "Hole mobility enhancements in strained Si/Si1-yGey p-type metal-oxide-semiconductor field-effect transistors grown on relaxed Si1-xGex (x<y) virtual substrates," *Applied Physics Letters*, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," *Journal of Vacuum Science and Technology A*, vol. 20, No. 3 (May/Jun. 2002) pp. 1020-1033.

Liu et al., "Growth Study of Surfactant-Mediated Relaxed SiGe Graded Layers for 1.55-µM Photodetector Applications," *Thin Solid Films*, vol. 380, Issue 1-2 (2000) pp. 54-56.

Liu et al., "High-Quality Ge Films on Si Substrates Using SB Surfactant-Mediated Graded SiGe Buffers," *Applied Physics Letters*, vol. 79, Issue 21 (Nov. 19, 2001) pp. 3431-3433.

Lu et al., "High Performance 0.1 µm Gate-Length P-Type SiGe MODFET's and MOS-MODFET's", *IEEE Transactions on Electron Devices*, vol. 47, No. 8 (Aug. 2000) pp. 1645-1652.

Luan et al., "High Quality Ge Epilayers on Si with Low Threading-Dislocations Densities," *Applied Physics Letters*, vol. 75, Issue 19 (Nov. 8, 1999) pp. 2909-2911.

Luo et al., "Compliant effect of low-temperature Si buffer for SiGe growth," *Applied Physics Letters*, vol. 78, No. 4 (2001) pp. 454-456.

Luo et al., "High-Quality Strain-Relaxed SiGe Films Grown with Low Temperature Si Buffer," *Journal of Applied Physics*, vol. 89, Issue 13 (Sep. 23, 1991) pp. 1611-1613.

Maiti et al., "Strained-Si heterostructure field effect transistors," *Semiconductor Science and Technology*, vol. 13 (1998) pp. 1225-1246.

Mazara, "Silicon-On-Insulator by Wafer Bonding: A Review", *Journal of the Electrochemical Society*, No. 1 (Jan. 1991) pp. 341-347.

Meyerson et al., "Cooperative Growth Phenomena in Silicon/Germanium Low-Temperature Epitaxy," *Applied Physics Letters*, vol. 53, No. 25 (Dec. 19, 1988) pp. 2555-2557.

Mizuno et al., "Advanced SOI-MOSFETs with Strained-Si Channel for High Speed CMOS-Electron/Hole Mobility Enhancement," 2002 Symposium on VLSI Technology, Honolulu (Jun. 13-15), *IEEE New York*, pp. 210-211.

Mizuno et al., "Electron and Hole Mobility Enhancement in Strained-Si MOSFETs on SiGe-on-Insulator Substrates Fabricated by SIMOX Technology," *IEEE Electron Device Letters*, vol. 21, No. 5 (May 2000) pp. 230-232.

Mizuno et al., "High Performance Strained-Si p-MOSFET's on SiGe-on-Insulator Substrates Fabricated by SIMOX Technology," *IEEE IDEM Technical Digest* (1999 International Electron Device Meeting) pp. 934-936.

Momose et al., "Dislocation-Free and Lattice-Matched Si/GAP1-xNx/Si Structure for Photo-Electronic Integrated Systems," *Applied Physics Letters*, vol. 79, Issue 25 (Dec. 17, 2001) pp. 4151-4153.

Monroe et al., "Comparison of Mobility-Limiting Mechanisms in High-Mobility Si1-xGex Heterostructures," *Journal of Vacuum Science and Technology B*, vol. B11, Issue 4 (Jul./Aug. 1993) pp. 1731-1737.

Nayak et al., "High-Mobility Strained-Si PMOSFET's" *IEEE Transactions on Electron Devices*, vol. 43, No. 10 (Oct. 1996) pp. 1709-1716.

O'Neill et al., "SiGe virtual substrate N-channel heterojunction MOSFETS," *Semiconductor Science and Technology*, vol. 14 (1999) pp. 784-789.

Oh et al., "Interdigitated Ge P-I-N Photodetectors Fabricated on a Si Substrate Using Graded SiGe Buffer Layers," *IEEE-Journal of Quantum Electronics*, vol. 38, Issue 9 (Sep. 2002) pp. 1238-1241.

Ohori et al., "Effect of Threading Dislocations on Mobility in Selectively Doped Heterostructures Grown on Si Substrates," *Journal of Applied Physics*, vol. 75, Issue 7 (Apr. 1, 1994) pp. 3681-1683.

Ota, "Application of heterojunction FET to power amplifier for cellular telephone," *Electronic Letters*, vol. 30, No. 11 (May 26, 1994) pp. 906-907.

Papananos, "Radio-Frequency Microelectronic Circuits for Telecommunication Applications," Kluwer Academic Publishers, (1999) pp. 115-117, 188-193.

Parker et al., "SiGe heterostructure CMOS circuits and applications," *Solid State Electronics*, vol. 43 (1999) pp. 1497-1506.

Powell et al., "New Approach to the Growth of Low Dislocation Relaxed SiGe Material," *Applied Physics Letters*, vol. 64, Issue 14 (Apr. 4, 1994) pp. 1856-1858.

Ransom et al., "Gate-Self-Aligned n-channel and p-channel Germanium MOSFET's," *IEEE Transactions on Electron Devices*, vol. 38, No. 12 (Dec. 1991) pp. 2695.

Reinking et al., "Fabrication of high-mobility Ge p-channel MOSFETs on Si substrates," *Electronics Letters*, vol. 35, No. 6 (Mar. 18, 1999) pp. 503-504.

Rim et al., "Enhanced Hold Mobilities in Surface-Channel Strained-Si p-MOSFETs," *IEDM* (1995), pp. 517-520.

Rim et al., "Fabrication and Analysis of Deep Submicron Strained-Si N-MOSFETs," *IEEE Transactions on Electron Devices*, vol. 47, No. 7 (Jul. 2000) pp. 1406-1415.

Rim, "Application of Silicon-Based Heterostructures to Enhanced Mobility Metal-Oxide-Semiconductor Field-Effect Transistors," PhD Thesis, Stanford University, 1999, pp. 1-184.

Robbins et al., "A model for heterogeneous growth of Si1-xGex films for hydrides," *Journal of Applied Physics*, vol. 69, No. 6 (Mar. 15, 1991) pp. 3729-3732.

Sadek et al., "Design of Si/SiGe Heterojunction Complementary Metal-Oxide-Semiconductor Transistors," *IEEE Transactions on Electron Devices* (Aug. 1996) pp. 1224-1232.

Sakaguchi et al., "ELTRAN® by Splitting Porous Si Layers," Proceedings of the 195th International SOI Symposium, vol. 99-3 (1999) pp. 117-121.

Sakai et al., "Reduction of Threading Dislocation Density in SiGe Layers on Si (001) Using a Two-Step Strain—Relaxation Procedure," *Applied Physics Letters*, vol. 79, Issue 21 (Nov. 19, 2001) pp. 3398-3400.

Samavedam et al., "Novel Dislocation Structure and Surface Morphology Effects in Relaxed Ge/Si-Ge (graded) / Si Structures," *Journal of Applied Physics*, vol. 87, Issue 7 (Apr. 1, 1997), pp. 3108-3116.

Schimmel, "Defect Etch for <100> Silicon Evaluation," *Journal of the Electrochemical Society*, vol. 126, No. 3 (Mar. 1979) pp. 479-482.

Schlaffer et al., "High-Mobility si and Ge Structures," *Semiconductor Science and Technology*, vol. 12 (1997) pp. 1515-1549.

Sugimoto et al., "A 2V, 500 MHz and 3V, 920 MHz Low-Power Current-Mode 0.6 μm CMOS VCO Circuit," *IEICE Trans Electron*, vol. E82-C, No. 7 (Jul. 1999) pp. 1327-1329.

Taylor et al., "Optoelectronic Device Performance on Reduced Threading Dislocation Density GaAs/Si," *American Institute of Physics*, vol. 89, Issue 8 (Apr. 15, 2001) pp. 4365-4375.

Ternent et al., "Metal Gate Strained Silicon MOSFETs for Microwave Integrated Circuits," *IEEE* (Oct. 2000) pp. 38-43.

Ting et al., "Monolithic Integration of III-V Materials and Devices on Silicon," *SPIE Conference 1999-Silicon Based Optoelectronics*, vol. 3630 (Jan. 1999) pp. 19-28.

Tsang et al., "Measurements of alloy composition and strain in thin $Ge_xSi_{1-x}$ layers," *Journal of Applied Physics*, vol. 75, No. 12 (Jun. 15, 1994) pp. 8098-8108.

Tweet et al., "Factors determining the composition of strained GeSi layers grown with disilane and germane," *Applied Physics Letters*, vol. 65, No. 20 (Nov. 20, 1994) pp. 2579-2581.

Usami et al., "Spectroscopic study of Si-based quantum wells with neighboring confinement structure," *Semiconductor Science and Technology*, (1997), abstract.

Valtuena et al., "Influence of the Surface Morphology on the Relaxation of Low-Strained $InxGa1-x$ As Linear Buffer Structures," *Journal of Crystal Growth*, vol. 182 (1997) pp. 281-291.

Vyatkin et al., "Study of Strain Relaxation in Epitaxial Structure $GE_{0.2}SI0.8/SI$ At Thermo-Implantation Treatment by Ion Beam Channeling," *Matt. Res. Soc. Symp. Proc.*, vol. 585 (2000) pp. 183-189.

Watson et al., "Relaxed, Low Threading Defect Density Si0.7Ge0.3 Epitaxial Layers Grown on Si by Rapid Thermal Chemical Vapor Deposition," *Journal of Applied Physics*, vol. 75, Issue 1 (Jan. 1, 1994) pp. 263-269.

Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994) pp. 100-102/.

Welser et al., "Evidence of Real-Space Hot-Electron Transfer in High Mobility, Strained-Si Multilayer MOSFETs," *IEEE IDEM Technical Digest* (1993 International Electron Devices Meeting) pp. 545-548.

Welser et al., "NMOS and PMOS Transistors Fabricated in Strained Silicon/Relaxed Silicon-Germanium Structures," *IEEE IDEM Technical Digest* (1992 International Electron Devices Meeting) pp. 1000-1002.

Welser, "The Application of Strained Silicon/Relaxed Silicon Germanium Heterostructures to Metal-Oxide-Semiconductor Field-Effect Transistors," PhD Thesis, Stanford University (1994) pp. 1-205.

Wolf et al., "Silicon Processing for the VLSI Era, vol. 1: Process Technology," Lattice Press, Sunset Beach, CA (1986) pp. 384-386.

Xie et al., "Fabrication of High Mobility Two-Dimensional Electron and Hole Gases in GeSi/Si," *Journal of Applied Physics*, vol. 73, Issue 12 (Jun. 15, 1993) pp. 8364-8370.

Xie et al., "Semiconductor Surface Roughness: Dependence on Sign and Magnitude of Bulk Strain," *The Physical Review Letters*, vol. 73, No. 22 (Nov. 28, 1994) pp. 3006-3009.

Xie et al., "Very High Mobility Two-Dimensional Hole Gas in Si/GexSi1-x/Ge Structures Grown by Molecular Beam Epitaxy," *Applied Physics Letters*, vol. 63, Issue 16 (Oct. 18, 1993) pp. 2263-2264.

Xie, "SiGe Field Effect Transistors," *Materials Science and Engineering*, vol. 25 (1999) pp. 89-121.

Yamagata et al., "Bonding, Splitting and Thinning by Porous Si in ELTRAN®; SOI-Epi Wafer™," *Materials Research Society Symposium Proceedings*, vol. 681E (2001) pp. 18.2.1-18.2.10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000) pp. 161-163.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

* cited by examiner

| | QUALITATIVE EVALUATION OF DISLOCATION PILE-UP DENSITY | | | |
|---|---|---|---|---|
| % Ge | H* = 0.6 $T_{crit}$ | H = 1.25 $T_{crit}$ | H = 2 $T_{crit}$ | H = 5 $T_{crit}$ |
| 5 | HIGH | MEDIUM | LOW | LOW |
| 10 | HIGH | MEDIUM | MEDIUM | LOW |
| 15 | HIGH | MEDIUM | MEDIUM | LOW |

* THICKNESS (H) OF THE SEED LAYER RELATIVE TO ITS CRITICAL THICKNESS ($T_{crit}$)

FIG. 3

SEMICONDUCTOR HETEROSTRUCTURES HAVING REDUCED DISLOCATION PILE-UPS AND RELATED METHODS

CROSS-REFERENCE TO RELATED APPLICATION

This application is a continuation application of U.S. Ser. No. 10/646,353, filed Aug. 22, 2003, which claims the benefits of and priority to U.S. Provisional Application Ser. No. 60/405,484, filed on Aug. 23, 2002; the entire disclosures of these applications are hereby incorporated by reference.

FIELD OF THE INVENTION

This application relates generally to semiconductor substrates and specifically to substrates comprising relaxed lattice-mismatched semiconductor layers.

BACKGROUND

The increasing operating speeds and computing power of microelectronic devices have recently given rise to the need for an increase in the complexity and functionality of the semiconductor structures that are used as the starting substrates in these microelectronic devices. Such "virtual substrates" based on silicon and germanium provide a platform for new generations of very large scale integration ("VLSI") devices that exhibit enhanced performance when compared to devices fabricated on bulk Si substrates. Specifically, new technological advances enable formation of heterostructures using silicon-germanium alloys (hereinafter referred to as "SiGe" or "$Si_{1-x}Ge_x$") to further increase performance of the semiconductor devices by changing the atomic structure of Si to increase electron and hole mobility.

The important component of a SiGe virtual substrate is a layer of SiGe heterostructure that has been relaxed to its equilibrium lattice constant (i.e., one that is larger than that of Si). This relaxed SiGe layer can be directly applied to a Si substrate (e.g., by wafer bonding or direct epitaxy), or atop a relaxed graded SiGe buffer layer in which the lattice constant of the SiGe material has been increased gradually over the thickness of the layer. The SiGe virtual substrate may also incorporate buried insulating layers, in the manner of a silicon-on-insulator (SOI) wafer. To fabricate high-performance devices on these platforms, thin strained layers of semiconductors, such as Si, Ge, or SiGe, are grown on the relaxed SiGe virtual substrates. The resulting biaxial tensile or compressive strain alters the carrier mobilities in the layers, enabling the fabrication of high-speed and/or low-power-consumption devices. The percentage of Ge in SiGe and the method of deposition can have a dramatic effect on the characteristics of the strained Si layer. U.S. Pat. No. 5,442,205, "Semiconductor Heterostructure Devices with Strained Semiconductor Layers," incorporated herein by reference, describes one such method of producing a strained Si device structure.

An approach to epitaxially growing a relaxed SiGe layer on bulk Si is discussed in International Application Publication No. WO 01/22482, entitled "Method of Producing Relaxed Silicon Germanium Layers" and incorporated herein by reference. The method includes providing a monocrystalline Si substrate, and then epitaxially growing a graded $Si_{1-x}Ge_x$ layer with increasing Ge concentration at a gradient of less than 25% Ge per micrometer to a final Ge composition in the range of $0.1 \leq x \leq 1$, using a source gas of $Ge_xH_yC_z$ for the Ge component, on the Si substrate at a temperature in excess of 850° C., and then epitaxially growing a semiconductor material on the graded layer.

Another method of epitaxially growing a relaxed SiGe layer on bulk Si is discussed in a paper entitled, "Low Energy plasma enhanced chemical vapor deposition," by M. Kummer et al. (*Mat. Sci. &Eng.* B89, 2002, pp. 288-95) and incorporated herein by reference, in which a method of low-energy plasma-enhanced chemical vapor deposition (LEPECVD) is disclosed. This method allows the formation of a SiGe layer on bulk Si at high growth rates (0.6 µm per minute) and low temperatures (500-750° C.).

To grow a high-quality, thin, epitaxial strained Si layer on a graded SiGe layer, the SiGe layer is, preferably, planarized or smoothed to reduce the surface roughness in the final strained Si substrate. Current methods of chemical mechanical polishing ("CMP") are typically used to decrease roughness and improve the planarity of surfaces in semiconductor fabrication processes. U.S. Pat. No. 6,107,653, "Controlling Threading Dislocations in Ge on Si Using Graded GeSi Layers and Planarization," incorporated herein by reference, describes how planarization can be used to improve the quality of SiGe graded layers.

One technique suitable for fabricating strained Si wafers can include the following steps:

1. Providing a silicon substrate that has been edge-polished;
2. Epitaxially depositing a relaxed graded SiGe buffer layer to a final Ge composition on the silicon substrate;
3. Epitaxially depositing a relaxed $Si_{1-x}Ge_x$ cap layer having a constant composition on the graded SiGe buffer layer;
4. Planarizing or smoothing the $Si_{1-x}Ge_x$ cap layer and/or the relaxed graded SiGe buffer layer by, e.g., CMP;
5. Epitaxially depositing a relaxed $Si_{1-x}Ge_x$ regrowth layer having a constant composition on the planarized surface of the $Si_{1-x}Ge_x$ cap layer; and
6. Epitaxially depositing a strained silicon layer on the $Si_{1-x}Ge_x$ regrowth layer.

By introducing strain gradually over a series of low lattice mismatch interfaces, compositionally graded layers, as recited in step 2 above, offer a viable route toward integration of heavily lattice-mismatched monocrystalline semiconductor layers on a common substrate, offering a route towards increased functionality through monolithic integration.

The lattice constant of SiGe is larger than that of Si, and is a direct function of the amount of Ge in the SiGe alloy. As the SiGe graded buffer layer is epitaxially deposited, it will initially be strained to match the in-plane lattice constant of the underlying silicon substrate. However, above a certain critical thickness, the SiGe graded buffer layer will relax to its inherently larger lattice constant. The process of relaxation occurs through the formation of misfit dislocations at the interface between two lattice-mismatched layers, e.g., a Si substrate and a SiGe epitaxial layer (epilayer). Because dislocations cannot terminate inside a crystal, misfit dislocations have vertical dislocation segments at each end (termed "threading dislocations"), that may rise through the crystal to reach a top surface of the wafer. Both misfit and threading dislocations have stress fields associated with them. As explained by Eugene Fitzgerald et al., *Journal of Vacuum Science and Technology B*, Vol. 10, No. 4, 1992 (hereafter, "Fitzgerald et al."), incorporated herein by reference, the stress field associated with the network of misfit dislocations affects the localized epitaxial growth rate at the surface of the crystal.

This variation in growth rates may result in a surface crosshatch on lattice-mismatched, relaxed graded SiGe buffer layers grown on Si.

The deposition of the relaxed graded SiGe buffer layer enables engineering of the in-plane lattice constant of the SiGe cap layer (and therefore the amount of strain in the strained silicon layer), while reducing the introduction of dislocations. For example, compositionally graded SiGe layers grown on Si(001) offer at least a three-order-of-magnitude reduction in threading dislocation density (TDD) when compared to direct deposition of relaxed SiGe layers without such buffer layer, and the resulting relaxed SiGe layer acts as a "virtual substrate" for high mobility strained channels (e.g. strained Si). The stress field associated with misfit dislocations under certain conditions, however, may cause formation of linear agglomerations of threading dislocations, termed a "dislocation pile-up."

A dislocation pile-up is generally defined as an area comprising at least three threading dislocations, with a threading dislocation density greater than $5 \times 10^6/cm^2$, and with threading dislocations substantially aligned along a slip direction such that the linear density of dislocations within the pile-up and along a slip direction is greater than 2000/cm. For example, the slip directions in SiGe materials are in-plane <110> directions.

Numerous theories attempt to explain the nucleation of misfit dislocations regarding where they are formed in the crystal and by what process. These theories include formation at pre-existing substrate dislocations; heterogeneous formation at defects; and homogeneous formation, i.e., formation in defect-free, perfect crystal regions. As explained by Eugene Fitzgerald in an article published in *Materials Science Reports*, Vol. 7, No. 3, 1991 and incorporated herein by reference, however, the activation energy for homogeneous dislocation formation is so high that it is unlikely to occur. The most likely source of misfit dislocations in the crystal is heterogeneous nucleation at defects.

Thus, dislocation pile-ups can form through a variety of mechanisms, including heterogeneous nucleation from particles, nucleation from wafer edges, dislocation blocking via interactions with surface roughness (especially deep troughs in the characteristic crosshatch pattern) and buried dislocation strain fields, or untraceable nucleation events during growth of thick compositionally graded buffer layers.

As described in the article by Srikanth Samavedam et al. (published in *Journal of Applied Physics*, Vol. 81, No. 7, 1997, and incorporated herein by reference), a high density of misfit dislocations in a particular region of a crystal will result in that region having a high localized stress field. This stress field may have two effects. First, it may present a barrier to the motion of other threading dislocations attempting to glide past the misfits. This pinning or trapping of threading dislocations due to the high stress field of other misfit dislocations is known as work hardening. Second, the high stress field may strongly reduce the local epitaxial growth rate in that region, resulting in a deeper trough in the surface morphology in comparison to the rest of the surface crosshatch. This deep trough in the surface morphology may also pin threading dislocations attempting to glide past the region of high misfit dislocation density (MDD). This cycle may perpetuate itself and result in a linear region with a high density of trapped threading dislocations, i.e., a dislocation pile-up.

Thus, while the graded buffet approach has demonstrated considerable reduction of global threading dislocation density, the stress field associated with misfit dislocations under certain conditions may cause dislocation pile-up defects in the semiconductor heterostructure. Regardless of the specific mechanism behind pile-up formation, a high localized TDD present in dislocation pile-ups has a potentially devastating impact on the yield of devices formed in these regions and may render these devices unusable. Inhibiting the formation of dislocation pile-ups is, therefore, desirable.

SUMMARY OF THE INVENTION

It is an object of the present invention to provide a relaxed lattice-mismatched semiconductor heterostructure that overcomes the limitations of known semiconductor structures.

In various aspects of the present invention, dislocation pile-ups in compositionally graded semiconductor layers are reduced or substantially eliminated, thereby leading to increased semiconductor device yield and manufacturability. This is accomplished by introducing a semiconductor layer having a plurality of threading dislocations distributed substantially uniformly across its surface as a starting layer prior to the subsequent growth and relaxation of the compositionally graded layer and, optionally, as at least one intermediate layer during growth of the graded layer. This semiconductor layer may include a so-called "seed layer" disposed proximal to the surface of the semiconductor layer and having substantially uniformly distributed threading dislocations.

Also, it has been found that acceptable TDDs and dislocation pile-up densities (DPDs) in graded layers can be achieved at relatively high concentration gradients (e.g., in excess of 25% Ge per µm of thickness) through the use of the seed layer. In tandem or as a further improvement, the rate of deposition (i.e., the epitaxial growth rate) is kept sufficiently low to prevent high TDD and DPD. The result is a thinner overall structure that is less bowed and more economical, in terms of applied material, than structures with graded layers formed at lower gradients (e.g., as described in U.S. Pat. No. 5,221,413 (hereafter, "'413 patent")).

In general, in one aspect, the invention is directed to a semiconductor structure that includes a first semiconductor layer having a plurality of threading dislocations distributed substantially uniformly across a surface thereof; and a substantially relaxed compositionally uniform cap layer disposed over the surface of the first layer. In one embodiment, a lattice constant of the compositionally uniform cap layer is different from a lattice constant of the first layer.

The compositionally uniform cap layer may include at least one of a group II, a group III, a group IV, a group V, and a group VI element, for example, at least one of silicon and germanium. In one embodiment, the compositionally uniform cap layer includes more than approximately 10% germanium. The thickness of the compositionally uniform cap layer may range from about 0.5 µm to about 3.0 µm.

In various embodiments, the semiconductor structure also includes a strained semiconductor layer disposed over the compositionally uniform cap layer. The strained semiconductor layer may be tensilely strained and include, for example, tensilely strained silicon or tensilely strained silicon-germanium alloy, or compressively strained and include, for example, compressively strained germanium or compressively strained silicon-germanium alloy.

Also, the semiconductor structure may include a compositionally graded layer disposed between the compositionally uniform cap layer and the first layer. The graded layer may include at least one of a group II, a group III, a group IV, a group V, and a group VI element, for example, at least one of silicon and germanium. In one embodiment of the invention, the graded layer comprises silicon and germanium and has a grade rate greater than about 5% germanium per micrometer. In one version of this embodiment, the grade rate less than about 50% germanium per micrometer. In some embodiments, the graded layer is graded to a concentration of greater than about 10% germanium. The thickness of the graded layer may range from about 0.5 μm to about 10.0 μm.

In a particular embodiment of the invention, the first layer of the semiconductor structure includes an initial portion of the graded layer having a lower local grading rate than at least one subsequent portion of the graded layer. The threading dislocations are uniformly distributed in the initial portion. In some versions of this embodiment, the graded layer includes at least one of silicon and germanium. The difference in local grading rate may be greater than about 5% Ge/μm, for example, greater than about 20% Ge/μm. In one version of this embodiment, the grading rate of the initial portion of the relaxed graded buffer layer does not exceed about 10% Ge/μm. In another version, the discontinuity in Ge content at the interface between the initial portion and at least one subsequent portion of the relaxed graded layer does not exceed about 10% Ge, for example, does not exceed about 5% Ge.

In various embodiments, the first semiconductor layer includes a seed layer disposed proximal to the surface of the first layer. The threading dislocations may be uniformly distributed in the seed layer. The seed layer may be at least partially relaxed and compositionally either uniform or graded. Further, the thickness of the seed layer may exceed twice its equilibrium critical thickness. In some versions, the thickness of the seed layer is less than about five times its equilibrium critical thickness. At least a portion of the seed layer can be formed by growth at a growth temperature of about 850° C., for example, above 1000° C. The thickness of the seed layer may range from about 10 nm to about 1000 nm, for example, from about 30 nm to about 300 nm.

The cap layer, according to various embodiments of the invention, may have a DPD of less than about 1/cm, for example, less than 0.01/cm, and a TDD of less than about $5 \times 10^5/cm^2$.

In some version of this embodiment of the invention, the semiconductor structure also includes a compositionally graded layer disposed between the compositionally uniform cap layer and the seed layer. At least one of the graded layer and the seed layer may include at least one of silicon and germanium. According to one feature, a concentration of germanium in the graded layer is different than a concentration of germanium in the seed layer at an interface between the seed layer with the graded layer. Specifically, discontinuity in germanium concentration at an interface between the seed layer with the graded layer may range from about 2% to 50% Ge, for example, from about 5% to 15% Ge. In one embodiment, the semiconductor structure also includes at least one intermediate seed layer disposed within the graded layer.

In some embodiments, the semiconductor structure also includes a compositionally uniform buffet layer disposed between the compositionally uniform cap layer and the seed layer. The buffer layer may include silicon. In some versions of this embodiment, at least one of the buffer layer and the seed layer includes at least one of silicon and germanium. A concentration of germanium in the buffer layer may be different than a concentration of germanium in the seed layer at an interface between the seed layer with the buffer layer. The discontinuity in germanium concentration at an interface between the seed layer with the buffer layer may range from about 2% to 50% Ge, for example, from about 5% to 15% Ge.

In general, in another aspect, the invention features a method of fabricating a semiconductor structure having reduced threading dislocation pile-ups. The method includes the steps of providing a first semiconductor layer having a plurality of threading dislocations distributed substantially uniformly across a surface thereof; and forming a substantially relaxed and compositionally uniform cap layer over the surface of the first semiconductor layer. The first semiconductor layer inhibits formation of dislocation pile-ups in at least the cap layer.

In some embodiments, a lattice constant of the compositionally uniform cap layer is different from a lattice constant of the first layer. In other embodiments, the method further includes the step of forming a compositionally uniform buffer layer over the first layer prior to forming the cap. Also, the step of providing a first semiconductor layer according to the invention may include forming an at least partially relaxed seed layer over a semiconductor substrate, for example, by growing the seed layer to a thickness ranging between two and five times an equilibrium critical thickness of the seed layer. The method may also include the step of annealing the seed layer at a temperature above the deposition temperature thereof.

In other embodiments, the step of providing a first semiconductor layer includes implanting a species into the first semiconductor layer. The species, as well as the first semiconductor layer may include silicon.

In still other embodiments, the step of providing a first semiconductor layer includes providing a semiconductor-on-insulator substrate. Alternatively, the step of providing a first semiconductor layer may include providing a silicon substrate having a substantially uniform distribution of threading dislocations. A density of threading dislocations in the silicon substrate may exceed about $10^2/cm^2$. An average surface roughness of the silicon substrate may be greater than 1 Å, for example, greater than 5 Å.

In some embodiments, the method of the invention also includes the step of forming a compositionally graded layer prior to forming the cap layer, and, optionally, forming at least one seed layer within the compositionally graded buffer layer.

In yet another aspect, the invention features a method of forming a relaxed graded semiconductor layer on a substrate. The method according to this aspect of the invention includes the steps of providing a first semiconductor layer; and epitaxially growing over the first semiconductor layer a relaxed graded layer including at least one of silicon and germanium, with increasing germanium content at a gradient exceeding about 25% Ge/μm to a final composition having a germanium content ranging from greater than 0% to 100% and a threading dislocation density not exceeding about $10^7/cm^2$.

This aspect of the invention may include the following features. The graded layer may have a dislocation pile-up density not exceeding about 20/cm, for example, not exceeding about 1/cm or, as a further example, not exceeding about 0.01/cm. The grading rate may be at least 30% Ge/μm, for example, at least 40% Ge/μm. The epitaxial growth may occur at a temperature ranging from 900-1200° C., and at a rate greater than about 1 nm/s. The relaxed graded layer may have a thickness ranging from 0.1 to 4.0 μm.

In one embodiment, the first semiconductor layer has a plurality of threading dislocations distributed substantially uniformly across a surface thereof, and the method further includes the step of providing a compositionally uniform cap layer over the surface of the first layer. The cap layer is substantially relaxed, and the relaxed graded layer is grown over the cap layer.

In still another aspect, the invention features a semiconductor structure including a first semiconductor layer and, thereover, a relaxed graded epitaxial layer comprising silicon and germanium and graded with increasing germanium content at a gradient exceeding 25% Ge/μm to a final composition having a germanium content ranging from greater than 0% to 100%, wherein the structure has a threading dislocation density not exceeding $10^7/cm^2$. The dislocation pile-up density in this structure does not exceed 1/cm, for example, does not exceed 0.01/cm.

In still another aspect of the invention, the semiconductor structure includes a semiconductor substrate; a compositionally graded layer disposed over the substrate; and a substantially relaxed compositionally uniform cap layer disposed over the compositionally graded layer. The cap layer has a density of dislocation pile-ups less than 1/cm, for example, less than 0.01/cm.

In further aspects of the invention, the semiconductor structure includes a first semiconductor layer having a plurality of threading dislocations distributed substantially uniformly across a surface thereof; a compositionally uniform cap layer disposed over the surface of the first layer, the cap layer being substantially relaxed; and also either (or both of) a p-type metal-oxide-semiconductor (PMOS) transistor or an n-type metal-oxide-semiconductor (NMOS) transistor disposed over the relaxed cap layer.

The PMOS transistor may include a gate dielectric portion disposed over a portion of the relaxed cap layer and a gate disposed over the gate dielectric portion. The gate comprises a conducting layer, and a source and a drain including p-type dopants are disposed proximate the gate dielectric portion.

The NMOS transistor may include a gate dielectric portion disposed over a portion of the relaxed cap layer and a gate disposed over the gate dielectric portion. The gate comprises a conducting layer and a source and a drain including n-type dopants are disposed proximate the gate dielectric portion.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 3 depicts a table containing qualitative evaluation of DPD for seed layers of different thickness and germanium content according to various embodiments of the invention;

DETAILED DESCRIPTION

In accordance with various embodiments of the present invention, a semiconductor layer having a plurality of threading dislocations distributed substantially uniformly across its surface is used as a starting layer prior to the subsequent growth and relaxation of the compositionally graded layer and, optionally, as at least one intermediate layer during growth of the graded layer.

Figure 1:
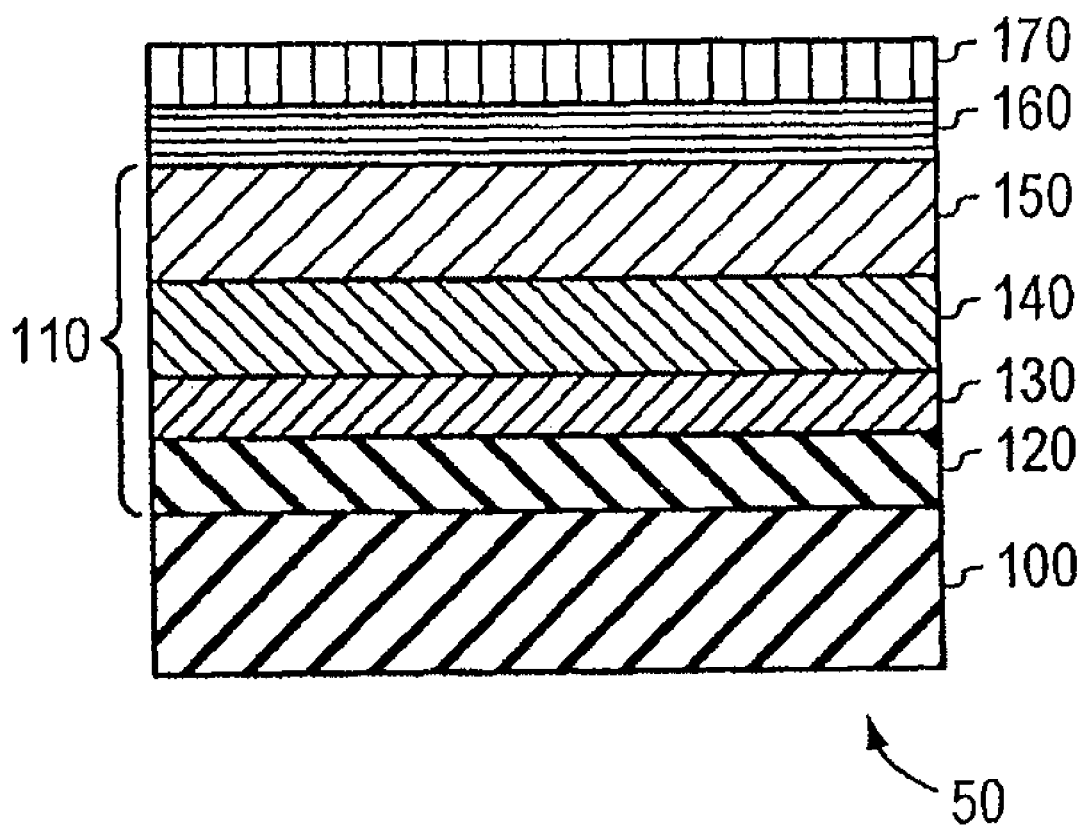
FIG. 1 depicts a schematic cross-sectional view of a semiconductor substrate with semiconductor layers formed thereon according to one embodiment of the invention.

Referring to FIG. 1, a semiconductor structure 50 made in accordance with the embodiments of the invention includes a substrate 100. The substrate 100, suitable for use with the invention, comprises a semiconductor, such as silicon, silicon deposited over an insulator, such as, for example, $SiO_2$, or a silicon-germanium alloy. In one embodiment, several semiconductor layers collectively referred to as layers 110 are epitaxially grown over the substrate 100. In this embodiment, the layers 110 and the substrate 100 may be referred to together as a "virtual substrate."

The epitaxially grown layers 110 can be grown in any suitable epitaxial deposition system, including, but not limited to, atmospheric-pressure CVD (APCVD), low- (or reduced-) pressure CVD (LPCVD), ultra-high-vacuum CVD (UHVCVD), or by molecular beam epitaxy. The epitaxial growth system may be a single-wafer or multiple-wafer batch reactor. The growth system also may utilize low-energy plasma to enhance the layer growth kinetics.

Suitable CVD systems commonly used for volume epitaxy in manufacturing applications include, for example, EPI CENTURA single-wafer multi-chamber systems available from Applied Materials of Santa Clara, Calif., or EPSILON single-wafer epitaxial reactors available from ASM International based in Bilthoven, The Netherlands.

In the CVD process, obtaining epitaxial growth typically involves introducing a source gas into the chamber. The source gas may include at least one precursor gas and a carrier gas, such as, for example hydrogen. In those embodiments of the invention where the layers are formed from Si, silicon precursor gases such as, for example, silane, disilane, trisilane, or dichlorosilane (DCS) trichlorosilane (TCS), or silicon tetrachloride may be used. Conversely, in those embodiments of the invention where the layers are formed from Ge, germanium precursor gases, such as, for example, germane ($GeH_4$), digermane, germanium tetrachloride, or dichlorogermane, or other Ge-containing precursors may be used. Finally, in the embodiments where the layers are formed from SiGe alloy, a combination of silicon and germanium precursor gases in various proportions is used.

In various embodiments of the invention, a compositionally graded or compositionally uniform seed layer 120, described in detail below, is epitaxially deposited over the substrate 100. Also, as described in detail below, a compositionally uniform buffer layer 130 may be deposited over the seed layer 120.

Still referring to FIG. 1, a relaxed compositionally graded layer 140 is epitaxially deposited over the substrate 100 (and, if present, layers and/or 130) in accordance with the parameters described herein. The relaxed graded layer 140 may include Si and Ge with a grading rate of, for example, over about 5% Ge per μm of thickness, and generally in the range of >5% Ge/μm to 100% Ge/μm, preferably between 5% Ge/μm and 50% Ge/μm, to a final Ge content of between about 10% to about 100% Ge. While the overall grading rate of the relaxed graded layer is generally defined as the ratio of total change in Ge content to the total thickness of the layer, a "local grading rate" within a portion of the graded layer may be different from the overall grading rate. For example, a graded layer including a 1 μm region graded from 0% Ge to 10% Ge (a local grading rate of 10% Ge/μm) and a 1 μm region graded from 10% Ge to 30% Ge (a local grading rate of 20% Ge/μm) will have an overall grading rate of 15% Ge/μm.

Thus, a relaxed graded layer may not necessarily have a linear profile, but may comprise smaller regions having different local grading rates.

The compositional grading in layer 140 may be accomplished, for example, by either linear grading or step grading, in which discrete steps in Ge composition are taken (e.g., 200 nm jumps of 2% Ge for a final grade rate of 10% Ge/μm). The highest grading rate that can be achieved with an acceptable TDD and DPD is ordinarily preferred in order to e layer thickness and the use of source gases. Acceptable TDD levels are typically less than $10^7/cm^2$ and preferably less than $5 \times 10^5/cm^2$, while acceptable DPD levels are typically less than 20/cm and preferably between 0 and 5/cm. For example, in the case of Si and Ge, grading rates in the range of 30-50% Ge/μm are found to be advantageous. Defect densities are measured using a standard chromic acid-based Schimmel etch as outlined in *Journal of the Electrochemical Society* 126:479 (1979), and an optical microscope operated in differential interference contrast (Nomarski) mode. Threading dislocation densities are calculated by counting the number of etch pits per unit area located away from dislocation pile-ups, yielding units of inverse area ($cm^{-2}$). Dislocation pile-up densities are calculated by measuring the total length of dislocation pile-ups per unit area, yielding units of inverse length ($cm^{-1}$). Defect densities may also preferably be confirmed by the use of a complementary characterization technique such as plan-view transmission electron microscopy.

The thickness of the relaxed graded layer 140 in accordance with the invention may range from, for example, about 0.1 μm to about 10 μm, preferably, between about 0.5 μm and about 4 μm. Additionally, the graded layers 140 may be grown at a temperature ranging, for example, between 600 and 1200° C. Higher growth temperatures, for example, exceeding 900° C. may be preferred to enable faster growth rates while minimizing the nucleation of threading dislocations.

A compositionally uniform (i.e. constant-composition) relaxed cap layer 150 is typically disposed over the graded layer 140. The cap layer 150 may, for example, include $Si_{1-x}Ge_x$ with a uniform composition, containing, e.g., 1-100% Ge, preferably between 10% and 90% Ge, and having a thickness of, for example, 0.2-3 μm, preferably over 0.5 μm. The constant-composition relaxed cap layer 150 and/or graded layer 140 may or may not be planarized or smoothed for surface roughness reduction. Planarization or smoothing may be accomplished by CMP or in situ epitaxy-based methods, for example, although other techniques are acceptable as well. The use of a planarization or smoothing process may result in relaxed cap layer 150 having a surface roughness less than 1 nm. In an alternative embodiment, the relaxed cap layer 150 may be formed directly on the substrate 100, without the graded layer 140.

A compressively strained layer 160 including a semiconductor material may be disposed over the relaxed cap layer 150. In one embodiment, the compressively strained layer 160 includes group IV elements, such as $Si_{1-y}Ge_y$, with a Ge content (y) higher than the Ge content (x) of the relaxed ($Si_{1-x}Ge_x$) cap layer. The compressively strained layer 160 may contain, for example, 1-100% Ge, preferably over 40% Ge, and may have a thickness of, e.g., 10-500 angstroms (Å), preferably below 200 Å. In some embodiments, the compressively strained layer 160 includes at least one group III and one group V element, e.g., indium gallium arsenide, indium gallium phosphide, or gallium arsenide. In alternative embodiments, the compressively strained layer 160 includes at least one group II and one group VI element, e.g., zinc selenide, zinc sulfide, cadmium telluride, or mercury telluride.

A tensilely strained layer 170 may be disposed over the compressively strained layer 160, sharing an interface therewith. In another embodiment, tensilely strained layer 170 is disposed under the compressively strained layer 160. Alternatively, in yet another embodiment, there is no compressively strained layer 160 and instead the tensilely strained layer 170 is disposed over the relaxed cap layer 150, sharing an interface therewith. In still another embodiment, a relaxed constant-composition regrowth layer (not shown) is disposed over the relaxed cap layer, sharing an interface therewith, and a tensilely strained layer is disposed over the constant-composition regrowth layer, sharing an interface with that layer. The regrowth layer may, for example, include $Si_{1-x}Ge_x$ with a uniform composition, containing, e.g., 1-100% Ge and having a thickness of, for example, 0.01-2 μm.

In one embodiment, the tensilely strained layer 170 is formed of silicon. In this embodiment, the strained layer 170 may be formed in a dedicated chamber of a deposition tool that is not exposed to Ge source gases, thereby avoiding cross-contamination and improving the quality of the interface between the tensilely strained layer 170 and either relaxed layer 150 or compressively strained layer 160. Furthermore, tensilely strained layer 170 may be formed from an isotopically pure silicon precursor(s). Isotopically pure Si has better thermal conductivity than conventional Si. Higher thermal conductivity may help dissipate heat from devices subsequently formed on the tensilely strained layer 170, thereby maintaining the enhanced carrier mobilities provided by the strained layer 170.

In other embodiments, the tensilely strained layer 170 may be formed of SiGe, or at least one of a group II, a group III, a group V, and a group VI element. In one embodiment, the tensilely strained layer is silicon having a thickness of, for example, 50-500 Å, preferably below 300 Å.

As mentioned above, according to the invention, dislocation pile-ups in compositionally graded semiconductor layer 140 and relaxed cap layer 150 are reduced or substantially eliminated by introducing a semiconductor layer having a plurality of threading dislocations distributed substantially uniformly across its surface as a starting layer prior to the subsequent growth and relaxation of the compositionaly graded layer and, optionally, as at least one intermediate layer during growth of the graded layer. Still referring to FIG. 1, in one embodiment, the so-called "seed layer" 120 is disposed proximal to the surface of the semiconductor substrate 100.

Figure 2:
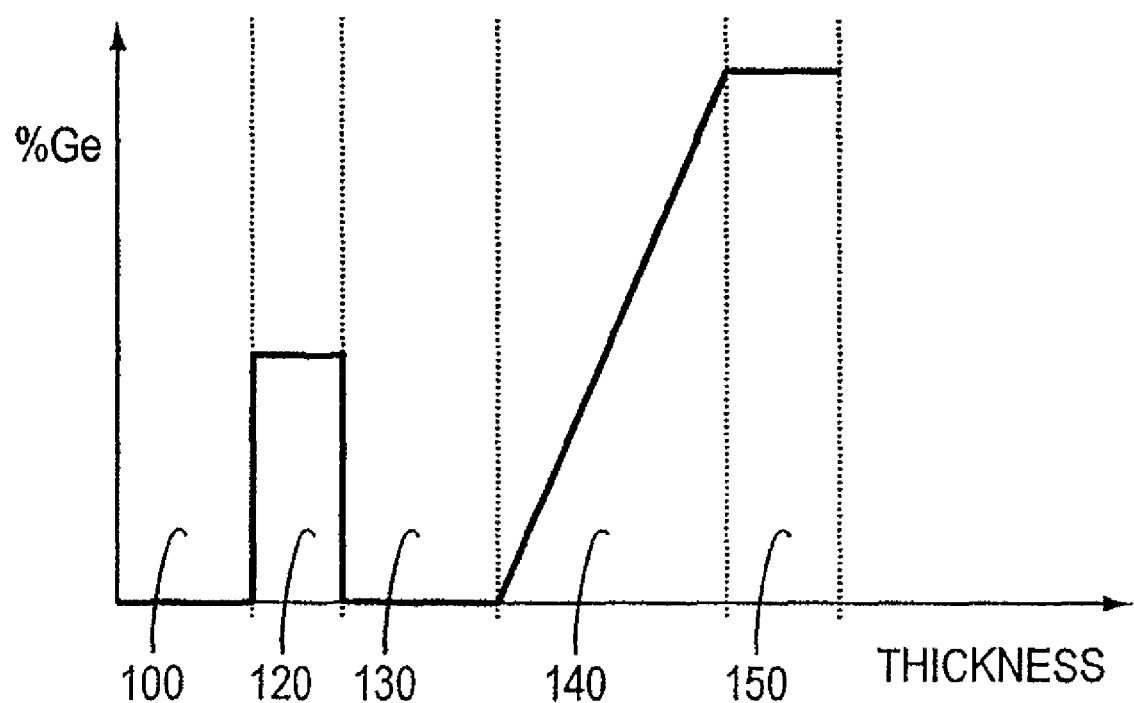
FIG. 2 depicts a graph of germanium concentration in different layers of the semiconductor structure of FIG. 1 plotted versus a schematic representation of its cross-sectional view, according to one version of the embodiment of FIG. 1.

FIG. 2 illustrates one embodiment of the semiconductor structure described with reference to FIG. 1. In this embodiment, this structure comprises SiGe materials and incorporates the seed layer 120. Referring to FIG. 2, Ge concentration is plotted versus schematic representation of the cross-section of the semiconductor device. For clarity, the thicknesses of layers 100-150 has been distorted.

In essence, the seed layer 120 comprises a partially or fully relaxed layer having threading dislocations substantially uniformly distributed therein and a discontinuity in composition between itself and at least one of subsequently deposited layers. The discontinuity in composition may either be positive or negative.

The seed layer 120 leads to a substantially uniform distribution of threading dislocations such that the threading dislocation density in an area does not differ by more than one order of magnitude from the density across the wafer. Moreover, the density of threading dislocations resulting from the seed layer may be greater than $100/cm^2$.

In some embodiments of the invention, for the SiGe materials system, the seed layer 120 may be a $Si_{1-y}Ge_y$ layer grown beyond its critical thickness on a Si substrate, upon which a SiGe graded layer is deposited. In the embodiment depicted in FIG. 2, the seed layer 120 has a uniform composition. In an alternative embodiment, at least a portion of the seed layer 120 is compositionally graded.

The seed layer may be, for example, 10 nm to 1000 nm in thickness. In a particular embodiment, the thickness of the seed layer 120 ranges from about 30 nm to about 300 nm thick. The seed layer 120 may comprises a Ge discontinuity of 2-50% Ge, preferably ranging from about 5% to about 15% Ge.

The seed layer 120 may prevent subsequent dislocation pile-up formation through any of several mechanisms. For example, since the seed layer 120 is partially or fully relaxed, the threading dislocation density in this layer may be substantially homogeneously (i.e. uniformly) distributed. This relaxation process supplies a randomly distributed array of threading dislocations that can be recycled throughout the subsequently deposited graded buffer layers, preventing heterogeneous dislocation distributions from forming during buffer growth and leading to dislocation pile-ups. Similarly, since the seed layer forms a larger initial lattice constant material upon which the graded buffer is deposited, the graded buffer grown on a seed layer ultimately needs to relax less lattice mismatch. This may help to prevent strain build-up during graded buffer growth, which can lead to nucleation of heterogeneous distributions of threading dislocations and ultimately dislocation pile-ups. Next, any residual compressive strain in the seed layer may also increase the effective stress that drives dislocation motion, leading to higher glide velocities and thus more efficient strain relaxation.

Additionally, as described in Eugene Fitzgerald et al., the number of sites activated to nucleate dislocations during layer relaxation is a function of the product of growth temperature and layer strain. Since the seed layer has a high built-in strain before relaxing, this implies that many sites (distributed substantially uniformly across the wafer) will be activated to form dislocations during layer relaxation. Thus, the condition which following equation (offered by D. Houghton, *Journal of Applied Physics*, 15 Aug. 1991, 2136-2151, incorporated by reference herein):

$$T_{crit}=(0.55/x)\ln(10T_{crit})$$

where $T_{crit}$ is given in nanometers (ntm).

Thus, in general, critical thickness decreases as the difference in Ge content x increases. For low Ge content discontinuities or, equivalently, low lattice mismatch (e.g. for x<0.1, corresponding to lattice mismatch of less than 0.4%), critical thickness is relatively large (e.g. greater than 30 nm) and relaxation proceeds relatively slowly as a function of thickness when the critical thickness is exceeded. For high Ge content discontinuities or, equivalently, high lattice mismatch (e.g. for x>0.1, corresponding to lattice mismatch of greater than 0.4%), critical thickness is relatively small and relaxation proceeds relatively quickly as a function of thickness when the critical thickness is exceeded. In some embodiments of the invention, the Ge discontinuity is positive, i.e. the seed layer 120 includes a greater Ge content than the adjacent layers. In other embodiments, the Ge discontinuity is negative, i.e. the seed layer 120 includes a lesser Ge content than the adjacent layers.

Thus, the conditions of partial or complete strain relaxation are governed by the amount of relaxation required to bring a mismatched film into equilibrium, and are a function of lattice mismatch. Kinetic limitations may inhibit equilibrium strain relaxation at low temperatures; however, because the seed layers described in FIG. 3 may be typically grown at temperatures greater than 1000° C., a temperature high enough to ensure equilibrium strain relaxation during growth, layers greater than their $T_{crit}$ will undergo strain relaxation in accordance with the criteria outlined above. In general, any SiGe layer grown above 850° C. should undergo equilibrium strain relaxation.

Embodiments referred to in FIG. 3, featured a 0.5 μm uniform composition $Si_{0.98}Ge_{0.02}$ buffer layer 130, the compositionally graded layer 140 grown via step grading to $Si_{0.8}Ge_{0.2}$ with a step in Ge composition to 4% Ge at the interface between the constant-composition buffer layer 130 and the compositionally graded layer 150, and a 2 μm uniform composition $Si_{0.8}Ge_{0.2}$ cap layer 150.

Still referring to FIG. 3, in various embodiments, the seed layer 120 has a relatively low lattice mismatch with respect to the adjacent layers, and is grown several times its critical thickness at a temperature high enough to ensure equilibrium strain relaxation. In one embodiment, the seed layer 120 is grown, preferably, from above two to about five times its critical thickness. In one example, the seed layer 120 including $Si_{0.94}Ge_{0.06}$ is grown to five times its equilibrium critical thickness on a Si substrate at 1075° C. Of course, this specific embodiment is exemplary only and should not be construed as limiting, as other factors in the growth can affect overall pile-up density. For example, referring to FIG. 2, the grade rate of the compositionally graded layer 140 or the thickness and composition of constant-composition buffer layer 130 will also affect pile-up density. The inclusion of seed layer 120 may reduce DPD from 1-50/cm to <1/cm in the wafer center and from 5-70/cm to <1/cm at the wafer edge (compared to identical samples without the seed layer 120). In some embodiments, including those discussed below, inclusion of the seed layer 120 may reduce DPD to <0.01/cm at both the wafer center and the wafer edge.

Figure 4:
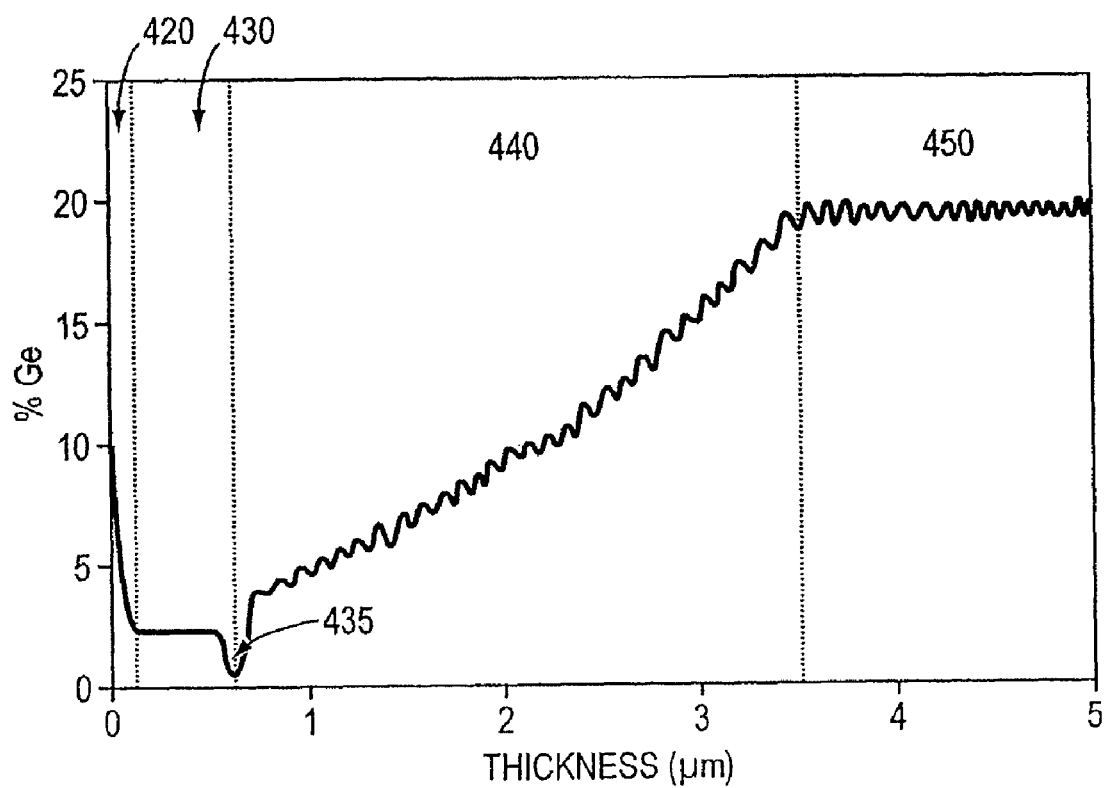
FIG. 4 depicts a graph of germanium concentration in different layers of the semiconductor structure of FIG. 1 plotted versus a schematic representation of its cross-sectional view according to another version of the embodiment of FIG. 1.

Referring to FIG. 4, in other embodiments, as mentioned above, the seed layer itself may comprise a compositional gradient. In these embodiments, the general design requirements for the seed layer are identical as described above, i.e. the entire seed layer structure undergoes partial or full strain relaxation. As shown in FIG. 4, the semiconductor structure incorporates a graded seed layer 420, a constant-composition buffer layer 430, a compositionally graded layer 440 and a uniform composition cap layer 450. The structure also incorporates a discontinuity 435 in Ge composition between the constant-composition buffer layer 430 and the compositionally graded buffer layer 440, wherein the Ge content drops to nearly 0% Ge and then abruptly climbs to approximately 4% Ge.

Figure 5:
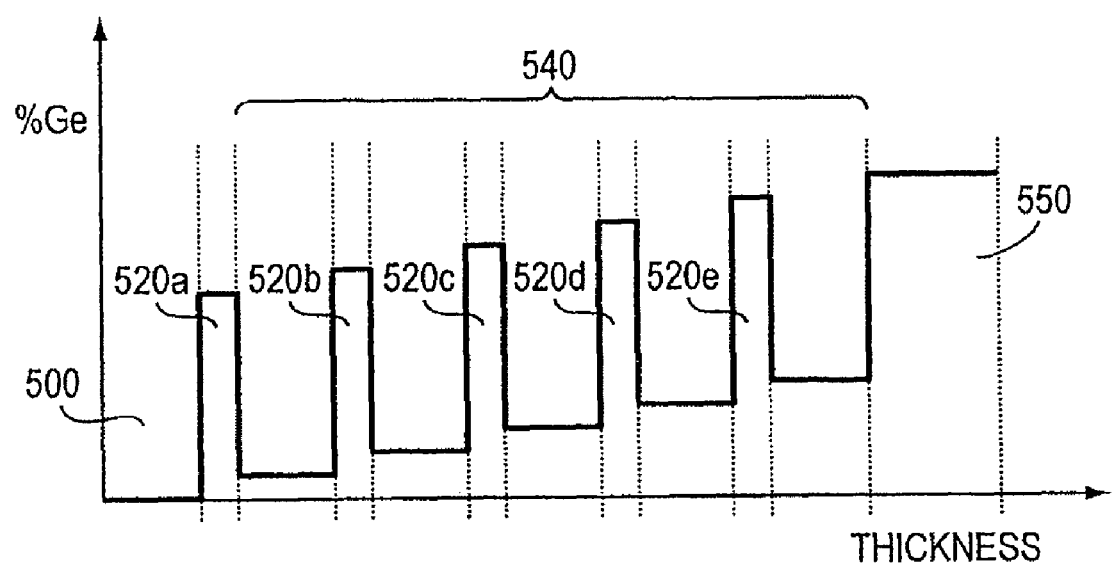
FIG. 5 depicts a graph of germanium concentration in different layers of the semiconductor structure according to an alternative embodiment of the invention.

In other embodiments, one or more seed layers may be incorporated within the compositionally graded layer. Referring to FIG. 5, in one embodiment, the Ge concentration in the substrate 500, multiple seed layers 520, a graded layer 540, and a relaxed cap layer 550 is plotted versus a schematic representation of the cross-section of the semiconductor device. For clarity, the thicknesses of layers 500-550 have been distorted. As shown in FIG. 5, the graded buffer 540 incorporates multiple seed layers 520. The seed layers 520a, 520b, 520c, 520d, and 520e are inserted between discrete steps in the compositionally graded layer 540 grown via step grading. The entire structure is then terminated with a uniform-composition cap layer 550. In this embodiment, the use of multiple seed layers advantageously facilitates uniform distribution of misfit dislocations throughout the entire structure and may thereby reducing DPD even further, as compared to the embodiments having a single seed layer. Additionally, although FIG. 5 depicts multiple seed layers 520 having positive discontinuities in Ge concentration, any of the multiple seed layers 520 may include a negative discontinuity in Ge concentration compared to the adjacent layers.

Notwithstanding the foregoing examples, it should be stressed that the invention is applicable to a wide range of epitaxial growth conditions, including but not limited to any combination of precursor source gases or liquids (such as, for example, silane, dichlorosilane, trichlorosilane, silicon tetrachloride, germane, germanium tetrachloride, and other germanium halides), any growth pressure, any growth temperature, any layer growth rate, and any graded buffer layer grade rate.

Other methods to reduce DPD may be used in lieu of introduction of seed layers without deviating from the scope of the invention. Specifically, in some embodiments of the invention, a substantially uniform distribution of threading dislocations may be formed on a semiconductor substrate by methods other than through growth of a distinct seed layer. For example, in one embodiment, growth of the graded layer is controlled in a predetermined manner so that an initial portion of the relaxed graded layer has a lower local grading rate than at least one subsequent portion. The more uniform relaxation of this initial portion may then provide a substantially uniform distribution of threading dislocations prior to growth and relaxation of the subsequent sublayers of the graded layer. In one version of this embodiment, the difference in local grading rate may be greater than 5% Ge/μm. In another version, the difference in local grading rate may be greater than 20% Ge/μm. In a particular version of this embodiment, the grading rate of the initial portion of the relaxed graded buffer layer may be <10% Ge/μm. Also, the discontinuity in Ge content at the interface between the initial and subsequent portions of the relaxed graded buffer layer may be <10% Ge, for example, <5% Ge.

In still another embodiment, use of the graded layer having substantially uniform distribution of threading dislocations in its initial portion, as described above, may supplement the use of one or more seed layers during the growth of the relaxed graded buffer layer as depicted in FIG. 5.

In yet another embodiment, the semiconductor substrate may be cut from a bulk semiconductor crystal (e.g. a Si wafer cut from a large cylindrical boule of Si) with pre-existing threading dislocations. These threading dislocations are preferably dislocations that will be glissile during subsequent epitaxy of lattice mismatched materials (e.g., the 60° dislocations that relieve lattice mismatch strain in Si, SiGe, and other diamond cubic semiconductors, as recognized by those skilled in the art). Other techniques may also be used to introduce a substantially uniform distribution of threading dislocations on a semiconductor substrate. In one embodiment, the substrate is damaged by ion implantation. This implant damage may form dislocations that are substantially uniformly distributed across the substrate surface. For example, the implantation of species such as Si, Ge, $BF_2$, As, a noble gas, or others may result in enough lattice damage so that dislocations are formed. In another embodiment, a substrate with a rough surface may be used. This may be a substrate, e.g. Si, that has not yet undergone a final polishing step to mirror smoothness (e.g. remnant surface roughness levels greater than <1-2 Å roughness common to Si substrates typical in the art). Alternatively, a smooth Si substrate may be roughened by a physical or chemical process (e.g. physical roughening, etching, oxidation and removal of surface oxide, etc). Growth of lattice-mismatched layers, e.g. compositionally graded buffer layers, on such rough substrates may result in substantially uniform nucleation of threading dislocations across the wafer surface. This may be preferable to non-uniform nucleation of dislocations at relatively few heterogeneous sites on the surface (e.g. surface particles) or at certain locations along the substrate edge.

Use of a substrate having uniform distribution of misfit dislocations, such as a semiconductor substrate having a seed layer deposited thereon (or the ability to tolerate a certain level of dislocation pile-ups) can facilitate high grade rates in overlying graded layers. In general, the desire to avoid high DPDs motivates the use of grade rates lower than, for example, 25% per micrometer (as described in the '413 patent mentioned earlier). While this approach may be suitable for many applications, such low composition gradients result in relatively thick SiGe layers to achieve a given Ge content, which may exhibit certain disadvantages. For example, since wafer bow is a function of thickness and growth temperatures, thicker layers may cause greater wafer bow. As is known to those skilled in the art, this wafer bow can pose problems for subsequent wafer processing steps, such as CMP or lithography. Thicker layers also, of course, imply the use of larger amounts of source material. In addition to the obvious economic disadvantage, use of larger amounts of source material for thicker layers also results in two other drawbacks for epitaxial processing: additional epitaxial reactor wall coating, and additional particle deposition on wafers. Both of these adversely affect wafer quality and economics. Thinner layers may also be preferred for better heat dissipation (in particular, the thermal conductivity of SiGe layers is less than that of comparable Si layers). Accordingly, thinner epitaxial layers may be preferable to thicker layers.

It has been found that acceptable TDDs and DPDs can be achieved with concentration gradients in excess of 25% Ge per micrometer of thickness by using a seed layer (or alternative approaches to achieving substantially uniform distribution of threading dislocations on a semiconductor substrate as described above), or if the rate of deposition (i.e., the epitaxial growth rate) is kept sufficiently low and some pile-ups can be tolerated. In terms of process time, the higher concentration gradient balances a lower deposition rate, so the total epitaxial process time may be similar or even identical to the process times associated with lower grading rates. As a result, the savings in material costs are not offset by sacrifice in terms of time efficiency.

Figure 6:
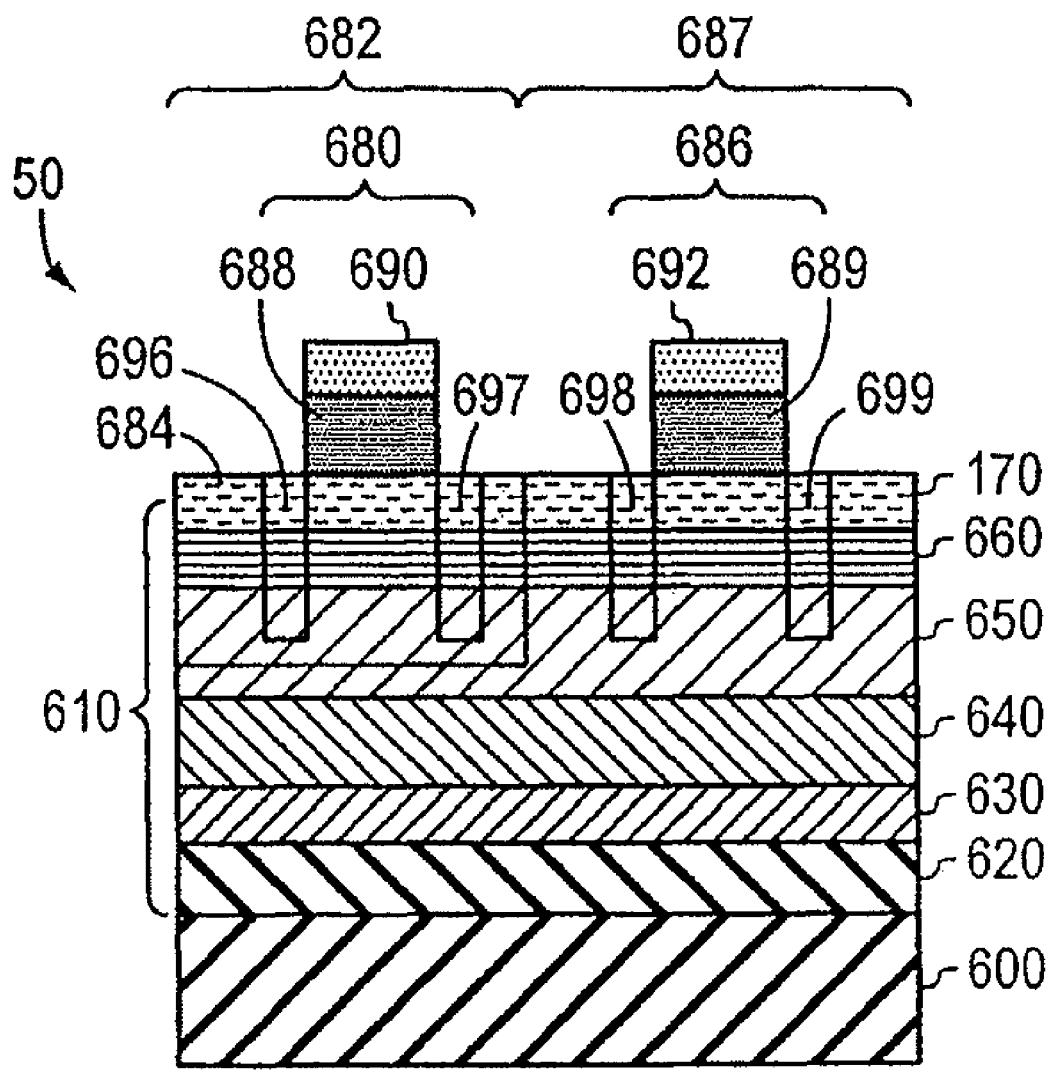
FIG. 6 depicts a schematic cross-sectional view of a semiconductor substrate with PMOS and NMOS transistors formed thereon according to an embodiment of the invention.

Semiconductor wafers having epitaxial layers disposed over the semiconductor substrate, as described above with reference to FIGS. 1-5, may be used for the fabrication of various devices, including, for example, CMOS devices and circuits. Referring to FIG. 6, a p-type metal-oxide-semiconductor (PMOS) transistor 680 is formed in a first region 682 of the semiconductor wafer 50. An n-type well 684 is formed in the layers 110 in the first region 682. An n-type metal-oxide-semiconductor (NMOS) transistor 686 is formed in a second region 687 of the semiconductor wafer 50. The PMOS transistor 680 and the NMOS transistor 686 include, respectively, a first gate dielectric portion 688 disposed over a first portion of the relaxed cap layer 650 and a second gate dielectric portion 689 disposed over a second portion of the relaxed cap layer 650. The first and second gate dielectric portions 688, 689 may comprise a gate oxide such as silicon dioxide. A first gate 690 is disposed over the first gate dielectric portion 688, and a second gate 692 is disposed over the second gate dielectric portion 689. The first and second gates 690, 692 may be formed from a conductive material, such as doped polysilicon, metal, or a metal silicide. A first source 696 and a first drain 697 (defined for purposes of illustration by the interior boundaries) are formed in the first region 682, proximate the first gate 690. The first source 696 and first drain 697 may be formed by the implantation of p-type ions, such as boron. The PMOS transistor 680 includes the first source 696, the first drain 697, the first gate 690, and the first dielectric portion 688. A second source 698 and a second drain 699 (defined for purposes of illustration by the interior boundaries) are formed in the second region 687, proximate the second gate 692. The second source 698 and the second drain 699 may be formed by the implantation of n-type ions, such as phosphorus. The NMOS transistor 686 includes the second source 698, the second drain 699, the second gate 692, and the second dielectric portion 689. Either of strained layers 160 and 170 may be absent from either transistor structure after fabrication.

Semiconductor wafers having epitaxial layers disposed over the semiconductor substrate, as described above with reference to FIGS. 1-5, may be used for the fabrication of various other structures, including, for example, strained semiconductor on insulator (SSOI) substrates. Such fabrication may be accomplished by wafer bonding of a semiconductor structure to a handle wafer comprising an insulator. Referring briefly to FIG. 1, the substrate 100 and layers 110 are then removed, resulting in either or both of strained layers 160, 170 being disposed on the handle wafer. Alternately, the strained layers 160, 170 may be absent from semiconductor structure 50 prior to bonding, and a portion of the relaxed cap layer 150 may be disposed on the handle wafer after bonding and removal of the substrate 100 and the rest of layers 110. Semiconductor layers, including strained layers, may then be disposed on either final SSOI structure. Techniques for creating SSOI structures, while well-known in the art, are further described, for example, in U.S. Pat. No. 6,602,613, incorporated herein by reference.

The invention may be embodied in other specific forms without departing from the spirit of essential characteristics thereof. The foregoing embodiments are therefore to be considered in all respects illustrative rather than limiting on the invention described herein.

What is claimed is:

1. A method for forming a semiconductor structure, the method comprising the steps of:
    epitaxially growing over a substrate a relaxed graded layer comprising a III-V compound, the III-V compound comprising a group III element and a group V element; and
    epitaxially growing a compositionally uniform cap layer comprising the group III element and the group V element over the relaxed graded layer,
    wherein (i) a concentration of the group III element in the relaxed graded layer increases at a grading rate exceeding about 25% per micrometer, (ii) a threading dislocation density of the compositionally uniform cap layer is less than approximately $10^7/cm^2$, and (iii) the group V element comprises phosphorous.

2. The method of claim 1, wherein the group III element comprises indium.

3. The method of claim 1, wherein the group III element comprises gallium.

4. The method of claim 1, wherein the relaxed graded layer further comprises arsenic.

5. The method of claim 1, wherein the group III element comprises indium, the relaxed graded layer further comprises arsenic, and the relaxed graded layer further comprises gallium.

6. The method of claim 1, further comprising epitaxially growing at least one strained layer comprising a III-V compound over the compositionally uniform cap layer.

7. The method of claim 1, further comprising:
    bonding the semiconductor structure to a handle wafer; and
    removing at least the substrate.

8. The method of claim 1, wherein the compositionally uniform cap layer has a dislocation pile-up density less than approximately 1/cm.

9. The method of claim 1, wherein the relaxed graded layer comprises at least two regions having different local grading rates.

10. The method of claim 1, wherein the threading dislocation density of the compositionally uniform cap layer is less than approximately $5 \times 10^5/cm^2$.

11. A method for forming a semiconductor structure, the method comprising the steps of:
    epitaxially growing over a substrate a relaxed graded layer comprising a III-V compound, the III-V compound comprising a group III element and a group V element; and
    epitaxially growing a compositionally uniform cap layer comprising the group III element and the group V element over the relaxed graded layer,
    wherein (i) a concentration of the group III element in the relaxed graded layer increases at a grading rate exceeding about 25% per micrometer, (ii) a threading dislocation density of the compositionally uniform cap layer is less than approximately $10^7/cm^2$, (iii) the group III element comprises indium, (iv) the group V element comprises phosphorous, and (v) the relaxed graded layer further comprises gallium.

12. The method of claim 11, further comprising epitaxially growing at least one strained layer comprising a III-V compound over the compositionally uniform cap layer.

13. The method of claim 11, further comprising:
    bonding the semiconductor structure to a handle wafer; and
    removing at least the substrate.

14. The method of claim 11, wherein the compositionally uniform cap layer has a dislocation pile-up density less than approximately 1/cm.

15. The method of claim 11, wherein the relaxed graded layer comprises at least two regions having different local grading rates.

16. The method of claim 11, wherein the threading dislocation density of the compositionally uniform cap layer is less than approximately $5 \times 10^5/cm^2$.

* * * * *